(12) United States Patent
Nakamura et al.

(10) Patent No.: US 12,055,214 B2
(45) Date of Patent: Aug. 6, 2024

(54) TRANSMISSION DEVICE MONITORING SYSTEM

(71) Applicant: Hitachi, Ltd., Tokyo (JP)

(72) Inventors: Akihiro Nakamura, Tokyo (JP);
Koichiro Nagata, Tokyo (JP); Takuma Nishimura, Tokyo (JP)

(73) Assignee: HITACHI, LTD., Tokyo (JP)

( * ) Notice: Subject to any disclaimer, the term of this patent is extended or adjusted under 35 U.S.C. 154(b) by 289 days.

(21) Appl. No.: 17/752,420

(22) Filed: May 24, 2022

(65) Prior Publication Data

US 2023/0070822 A1 Mar. 9, 2023

(30) Foreign Application Priority Data

Sep. 3, 2021 (JP) .................. 2021-144289

(51) Int. Cl.
| | | |
|---|---|---|
| *F16H 61/12* | (2010.01) | |
| *F16H 59/14* | (2006.01) | |
| *F16H 59/70* | (2006.01) | |
| *G01M 13/028* | (2019.01) | |
| *G01R 19/00* | (2006.01) | |

(52) U.S. Cl.
CPC ............ F16H 61/12 (2013.01); F16H 59/14 (2013.01); F16H 59/70 (2013.01); G01M 13/028 (2013.01); G01R 19/0092 (2013.01); *F16H 2059/706* (2013.01); *F16H 2061/1208* (2013.01)

(58) Field of Classification Search
CPC .......... F16H 61/12; F16H 59/14; F16H 59/70; F16H 2059/706; F16H 2061/1208; F16H 2059/366; G01M 13/028; G01M 13/021; G01R 19/0092; G01R 31/343
See application file for complete search history.

(56) References Cited

U.S. PATENT DOCUMENTS

| | | | | |
|---|---|---|---|---|
| 5,406,483 A | * | 4/1995 | Kallis | F16H 61/12 192/3.3 |
| 6,073,072 A | * | 6/2000 | Ishii | F16H 61/12 477/154 |
| 6,898,975 B2 | * | 5/2005 | Blunt | G01H 1/003 73/593 |
| 2002/0138217 A1 | * | 9/2002 | Shen | G01H 1/003 702/56 |

(Continued)

FOREIGN PATENT DOCUMENTS

JP 2017-181282 A 10/2017

*Primary Examiner* — David J Bolduc
(74) *Attorney, Agent, or Firm* — MATTINGLY & MALUR, PC

(57) ABSTRACT

Provided is a transmission device monitoring system including: a diagnostic frequency estimation unit that extracts a plurality of diagnostic frequency candidate groups from a frequency region separated by a specific frequency or more using at least current information on a motor, a gear ratio of a transmission device, and the number of stages of the transmission device, and estimates a frequency satisfying a specific relationship from frequencies obtained in the plurality of diagnostic frequency candidate groups as a diagnostic frequency; and an abnormality diagnosis unit that diagnoses abnormality of the transmission device using at least the one diagnostic frequency estimated by the diagnostic frequency estimation unit.

11 Claims, 14 Drawing Sheets

(56) References Cited

U.S. PATENT DOCUMENTS

| | | | |
|---|---|---|---|
| 2004/0083045 A1* | 4/2004 | Nohara | F16H 59/70 |
| | | | 701/51 |
| 2009/0292505 A1* | 11/2009 | Van Dyke | G01M 13/028 |
| | | | 702/184 |
| 2014/0074427 A1* | 3/2014 | Ottewill | G01B 7/003 |
| | | | 702/151 |
| 2014/0167810 A1* | 6/2014 | Neti | G01R 31/343 |
| | | | 324/765.01 |
| 2014/0172326 A1* | 6/2014 | Zhang | G01M 13/04 |
| | | | 702/38 |
| 2016/0033580 A1* | 2/2016 | Qiao | G01R 31/343 |
| | | | 324/765.01 |
| 2016/0223430 A1* | 8/2016 | Yasui | G01M 13/02 |
| 2019/0033169 A1* | 1/2019 | Kamiya | F16H 57/01 |
| 2020/0040984 A1* | 2/2020 | Chen | F16H 3/091 |

* cited by examiner

TRANSMISSION DEVICE MONITORING SYSTEM

CROSS-REFERENCE TO RELATED APPLICATION

The present application claims priority from Japanese application JP2021-144289, filed on Sep. 3, 2021, the contents of which is hereby incorporated by reference into this application.

BACKGROUND OF THE INVENTION

1. Field of the Invention

The present invention relates to a transmission device monitoring system that monitors a transmission device driven by a motor.

2. Description of the Related Art

In recent years, due to spread of Internet of Things (IoT), advancement of artificial intelligence (AI), and a reduction in the working population, attention has been paid to a technique for automatically performing abnormality diagnosis of a mechanical device on the basis of information obtained by a sensor or the like. Among them, many diagnostic techniques using a vibration sensor have been disclosed for a device that operates by motor drive by utilizing the fact that vibration occurs when an abnormality occurs. As a typical method, there is a method for performing abnormality diagnosis of a rotating component such as a bearing or a gear by monitoring an increase in a component specific vibration frequency component (amplitude). In this method, an abnormal state can be estimated by increasing or decreasing of the frequency component, and at the same time, an abnormal part corresponding to each frequency can be identified.

At this time, identification of the vibration frequency is very important, and in particular in a system including a transmission, it is necessary to identify all vibration frequencies of shafts and rotating components before and after shifting. However, mechanical specifications (design specifications) for identifying these frequencies are not disclosed in many cases. In addition, even if information of the mechanical specifications is obtained, it may be difficult to detect a specific frequency in an environment where vibration from a machine or the like other than a machine to be diagnosed occurs everywhere. Therefore, there is a problem that it takes time to identify the frequency, an incorrect frequency is selected, or the like.

Therefore, JP 2017-181282 A discloses a method for identifying without specification information the vibration frequencies of rotating shafts and components before and after shifting even in a complicated device including the transmission or the like. Specifically, using a predicted value of the meshing frequency of the gear included in the transmission and a maximum peak value (an amplitude) within a range of the predicted value of the frequency, for example, a meshing frequency for diagnosing abnormality of the gear and the number of teeth of the gear (when the number of teeth is known, a reduction ratio and a rotational speed of each shaft can also be calculated) are identified.

SUMMARY OF THE INVENTION

However, the technique described in JP 2017-181282 A is applicable to a case where the vibration sensor is used, but is not suitable for a diagnosis method using a current sensor capable of diagnosing the rotating component like the vibration sensor.

This is because electrical noise (vibration) is superimposed on motor current simultaneously with a mechanical vibration component. It is a known fact that the mechanical vibration component generated at the time of abnormality is also superimposed on the motor current. The electrical noise is, for example, a harmonic generated when the motor (AC motor) is driven. Then, since the electrical noise may be larger than the peak value (amplitude) of the mechanical vibration, it is difficult to identify a mechanical vibration frequency (diagnostic frequency) for abnormality diagnosis by a method using maximum peak search as in JP 2017-181282 A.

The present invention has been made in view of the above circumstances, and an object of the present invention is to identify a vibration frequency for diagnosing abnormality of the rotating component of the transmission device from current information on a motor in which mechanical vibration and electrical vibration are compositely superimposed.

In order to solve the above problem, a transmission device monitoring system according to one aspect of the present invention is a transmission device monitoring system that monitors a transmission device driven by a motor, the transmission device monitoring system including: a diagnostic frequency estimation unit that extracts a plurality of diagnostic frequency candidate groups from a frequency region separated by a specific frequency or more using at least current information on the motor, a gear ratio of the transmission device, and the number of stages of the transmission device, and estimates a frequency satisfying a specific relationship from frequencies obtained in the plurality of diagnostic frequency candidate groups as a diagnostic frequency; and an abnormality diagnosis unit that diagnoses abnormality of the transmission device using at least the one diagnostic frequency estimated by the diagnostic frequency estimation unit.

According to at least one aspect of the present invention, it is possible to accurately and automatically estimate the vibration frequency component for diagnosing the abnormality of the rotating component of the transmission device from the current information on the motor in which the mechanical vibration and the electrical vibration are compositely superimposed. Then, by using the diagnostic frequency component, improvement of diagnostic accuracy and reduction of time required to construct the transmission device monitoring system can be expected.

Problems, configurations, and effects other than those described above will be clarified by the following description of embodiments.

DESCRIPTION OF THE PREFERRED EMBODIMENTS

Figure 1:
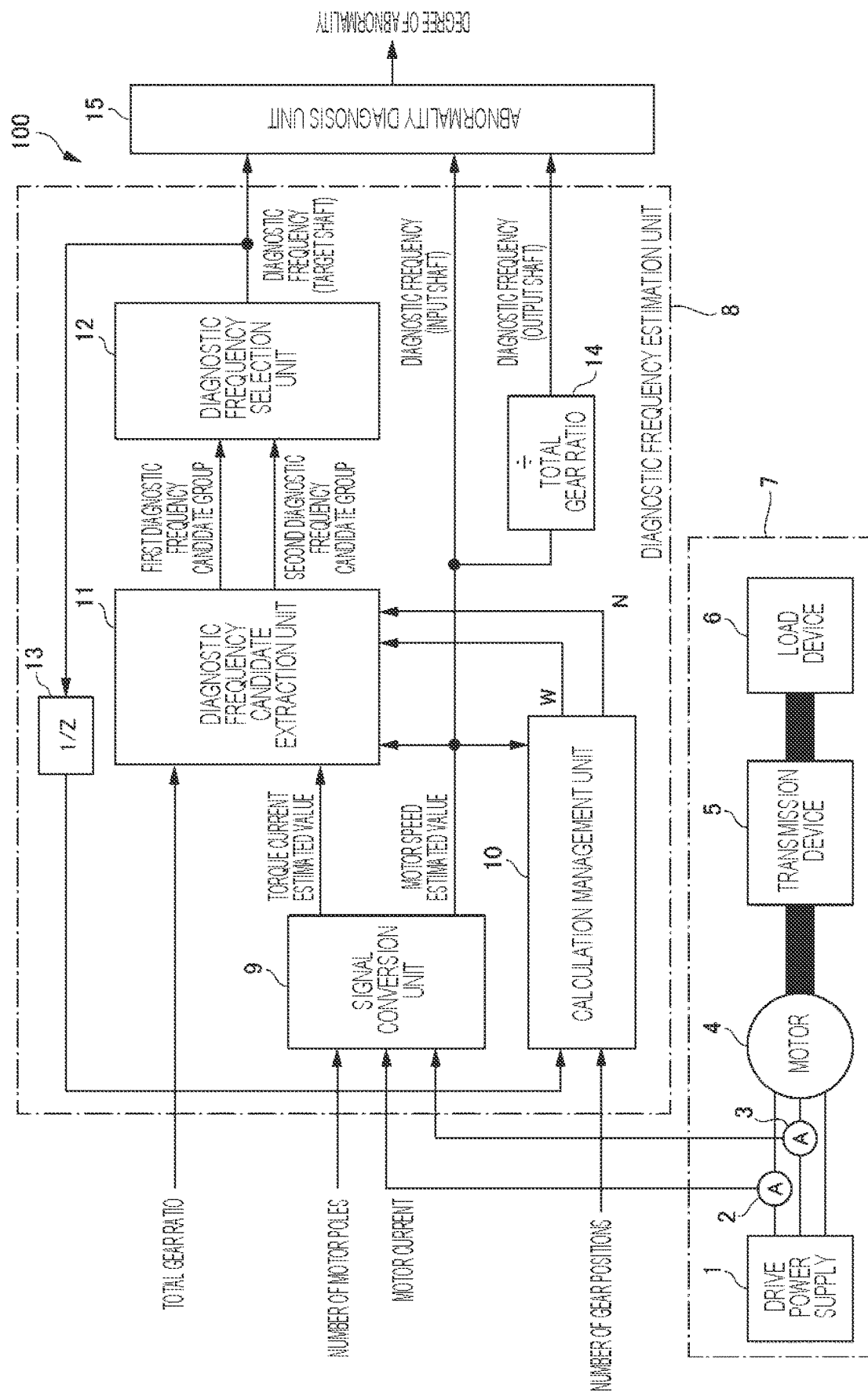
FIG. 1 is a block diagram illustrating a configuration example of a transmission device monitoring system according to a first embodiment of the present invention.

Hereinafter, examples of embodiments for carrying out the present invention will be described with reference to the accompanying drawings. In the present specification and the accompanying drawings, components having substantially the same function or configuration are denoted by the same reference numerals, and redundant description will be omitted.

First Embodiment

First, a transmission device monitoring system according to a first embodiment of the present invention will be described.

In the first embodiment of the present invention, the transmission device monitoring system for diagnosing abnormality of a mechanical device (particularly a transmission device) by estimating a vibration frequency (diagnostic frequency) necessary for diagnosis of a rotating component on the basis of two phase motor current and information on a total gear ratio of the mechanical device, the number of gear positions, and the number of motor poles will be described.

Configuration of Transmission Device Monitoring System

FIG. 1 is a block diagram illustrating a configuration example of the transmission device monitoring system according to the first embodiment of the present invention.

In FIG. 1, a transmission device monitoring system 100 that monitors a state of a mechanical device 7 includes a diagnostic frequency estimation unit 8 and an abnormality diagnosis unit 15. The diagnostic frequency estimation unit 8 estimates a diagnostic frequency using the total gear ratio in the mechanical device 7, current information (motor current (phase current) in FIG. 1) on a motor 4 (three phase AC motor), the number of gear positions, and the number of motor poles as inputs. The abnormality diagnosis unit 15 calculates degree of abnormality of the mechanical device 7 using the diagnostic frequency calculated by the diagnostic frequency estimation unit 8 as an input, and monitors the state of the mechanical device 7. The number of gear positions is a value indicating how many times the shift is performed to realize the total gear ratio. In an example of a transmission device 5 illustrated in FIG. 6 to be described later, the number of gear positions is three.

Here, in the present specification, diagnostic frequencies are speeds (frequencies) of rotating shafts before and after shifting in the transmission device 5. In the transmission device 5 illustrated in FIG. 6, the diagnostic frequencies correspond to the speeds (frequencies) of the four rotating shafts 51 to 54. Hereinafter, the above-described devices and processing units will be described in detail.

Mechanical Device

First, the mechanical device 7 will be described.

The mechanical device 7 schematically represents an object to be diagnosed by the transmission device monitoring system 100. Examples of the mechanical device 7 include machine tools, fans/pumps, industrial equipment such as hoisting machines, automobiles, construction machinery, railway vehicles, and home electric appliances. The mechanical device 7 includes the motor 4 driven by an AC voltage from a drive power supply 1 that means a commercial power supply, an inverter, or the like, the transmission device 5 connected to a tip of the motor 4, and a load device 6 to which power is transmitted from the transmission device 5. Here, the transmission device 5 is a device that changes a rotational speed of the rotating shaft (rotating component) of a speed reducer or a speed booster by gears, in which all transmission mechanisms (gear ratios) included in the mechanical device 7 are combined.

Diagnostic Frequency Estimation Unit

Next, the diagnostic frequency estimation unit 8 will be described.

The diagnostic frequency estimation unit 8 is a processing block that extracts the frequencies (diagnostic frequencies) of the rotating shafts before and after shifting on the basis of input information such as a motor current value. Note that for frequencies other than frequencies of an input shaft (the rotating shaft 51) and an output shaft (the rotating shaft 54) of the transmission device 5 illustrated in FIG. 6, the diagnostic frequency estimation unit 8 estimates the frequency (diagnostic frequency) of the rotating shaft after shifting from the input shaft one by one stage (one step).

First, a signal conversion unit 9 receives two phase motor currents (phase currents) detected by current sensors 2 and 3 that are current detection means and the number of motor poles as information on current of the motor 4, and outputs a torque current estimated value and a motor speed estimated value. For example, the diagnostic frequency estimation unit 8 can be implemented by a microcomputer or a field programmable gate array (an FPGA), and the motor current is actually read via an AD converter (the AD converter is omitted in FIG. 1).

A torque current is a current flowing according to a torque generated in the motor 4, and can be handled as a DC amount with a small frequency change. The current obtained at this time is two phase current, but may be three phase current. Further, in the case of the two phase current, two phases to be obtained may be any combination of U phase, V phase, and W phase. In the present embodiment, it is assumed that the current is obtained from the U phase and the V phase.

The number of motor poles represents the number of poles of a magnet used for a rotating rotor of the motor 4. For the number of motor poles, for example, a user may manually input information described on a name plate of the motor 4 to the transmission device monitoring system 100. The torque current estimated value calculated by the signal conversion unit 9 is input to a diagnostic frequency candidate extraction unit 11. Further, the motor speed estimated value is input to a calculation management unit 10, and at the same time, is input to a division unit 14 that uses the total gear ratio and the abnormality diagnosis unit 15.

In the present embodiment, since the block diagram is described assuming that all components having the rotating shaft of the mechanical device 7 are diagnosed, the motor speed estimated value is used for the diagnosis of components arranged on the input shaft (the rotating shaft 51 that is the same rotating shaft as a motor shaft) of the transmission device 5. In addition, an output of the division unit 14 is used for the diagnosis of components arranged on the output shaft (rotating shaft 54) of the transmission device 5 in which all shifts have been completed. Note that the information on the total gear ratio may also be obtained from the name plate placed on the transmission device 5, similarly to the number of motor poles.

Next, the calculation management unit 10 to which the motor speed estimated value has been input also receives from a delay unit 13 the number of gear positions of the transmission device 5 and the diagnostic frequency (post-shift frequency one stage before; calculation step is managed by the calculation management unit 10) output one step before from a diagnostic frequency selection unit 12. Then, a pre-shift input frequency W that is information necessary for calculating the frequency after deceleration estimated by the diagnostic frequency candidate extraction unit 11, and the number of stages N indicating which gear position counting from the output shaft is calculated are output to the diagnostic frequency candidate extraction unit 11.

Further, the diagnostic frequency candidate extraction unit 11 to which the total gear ratio, the torque current estimated value, the motor speed estimated value, the input frequency W, and the number of stages N are input outputs a first diagnostic frequency candidate group and a second diagnostic frequency candidate group. Both the first and second diagnostic frequency candidate groups have one or more frequencies. Although the present embodiment is limited to two frequency candidate groups, the diagnostic frequency candidate extraction unit 11 may extract three or more frequency candidate groups.

The diagnostic frequency candidate extraction unit 11 calculates a frequency of a post-shift rotating shaft in a current gear position on the basis of a speed (for example, motor speed estimated value) of the motor 4, the gear ratio (total gear ratio) of the transmission device 5, the current gear position (the number of stages N) of the transmission device 5, and the input frequency W of the current gear position (the number of stages N), and extracts one or more frequencies (see FIG. 14 to be described later) as the second diagnostic frequency candidate group from a frequency spectrum obtained from the current information (for example, the torque current estimated value) on the motor 4 on the basis of the frequency of the post-shift rotating shaft. In addition, the diagnostic frequency candidate extraction unit 11 is configured to extract one or more frequencies (see FIG. 14 to be described later) as the first diagnostic frequency candidate group from the frequency spectrum obtained from the current information (for example, the torque current estimated value) on the motor 4 on the basis of a meshing frequency of a gear constituting the current gear position.

Thus, it is possible to accurately and automatically extract a vibration frequency component for diagnosing abnormality of the rotating component such as the rotating shaft and the gear of the transmission device 5 from the current information on the motor 4 in which mechanical vibration and electrical vibration are compositely superimposed.

Note that the signal conversion unit 9 is configured to estimate a speed of the motor 4 by dividing a frequency obtained by analyzing the current information (for example, the motor speed estimated value) on the motor 4 by the number of poles of the motor 4. In this manner, the motor speed estimated value can be obtained from the current information on the motor 4.

Finally, the diagnostic frequency selection unit 12 compares the first diagnostic frequency candidate group with the second diagnostic frequency candidate group, selects a frequency component commonly present in the two diagnostic frequency candidate groups, and outputs the selected frequency component as the diagnostic frequency. The frequency component commonly present in the two diagnostic frequency candidate groups is a frequency satisfying a specific relationship in frequencies obtained from the two diagnostic frequency candidate groups.

In this manner, the diagnostic frequency selection unit 12 can accurately select the diagnostic frequency by selecting, as the diagnostic frequency, the frequency satisfying the specific relationship from the frequencies obtained from the first diagnostic frequency candidate group and the second diagnostic frequency candidate group.

Here, the diagnostic frequency selection unit 12 can estimate the diagnostic frequency for each rotating shaft 51 to 54 (target shaft) to be diagnosed of the transmission device 5 and store or output the diagnostic frequency in a memory (not illustrated). Hereinafter, in particular, processing blocks of the signal conversion unit 9, the calculation management unit 10, the diagnostic frequency candidate extraction unit 11, and the diagnostic frequency selection unit 12 will be described in detail.

Signal Conversion Unit

First, details of the signal conversion unit 9 will be described with reference to FIG. 2.

Figure 2:
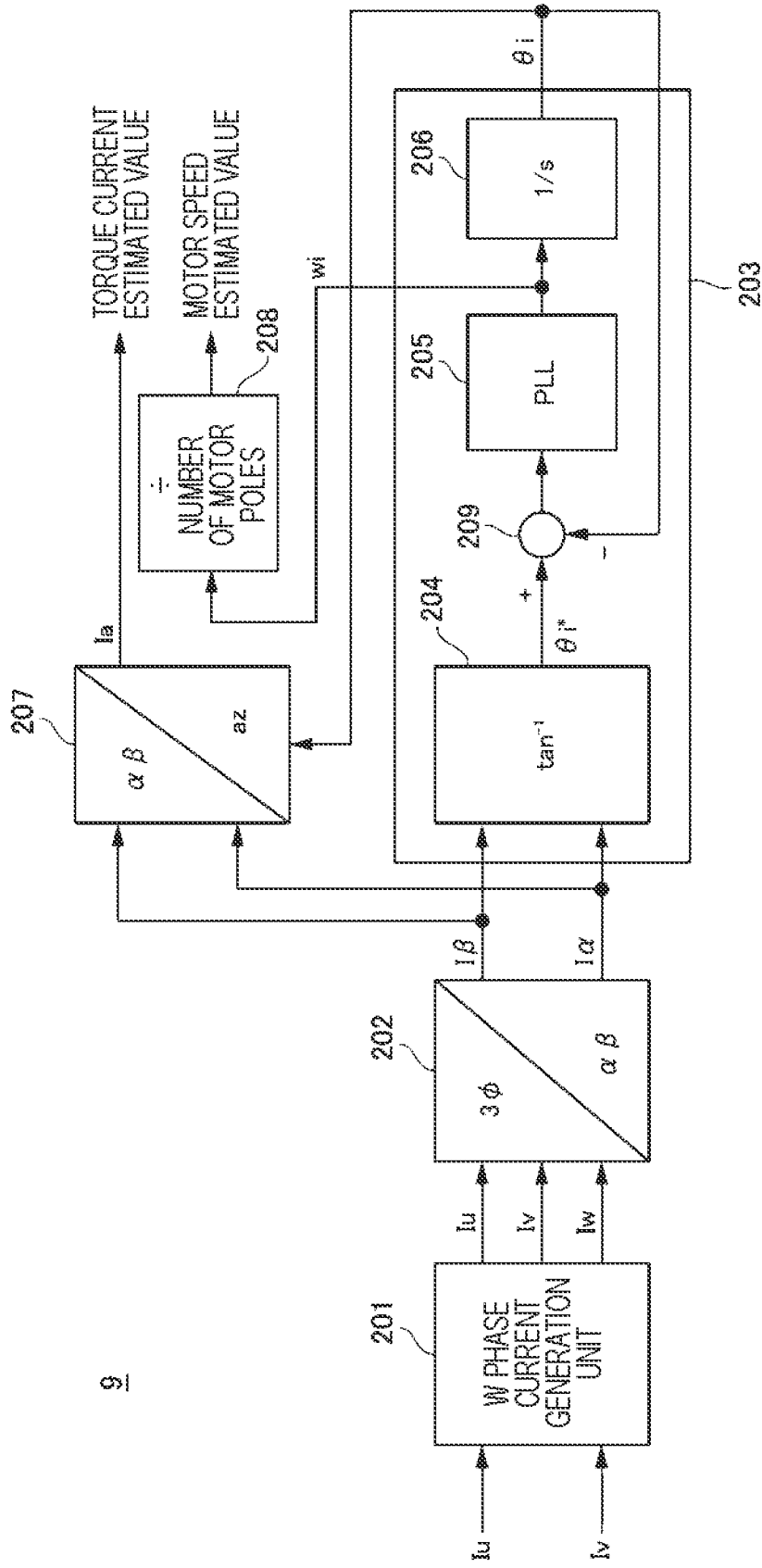
FIG. 2 is a block diagram illustrating a configuration example of a signal conversion unit according to the first embodiment of the present invention.

FIG. 2 is a block diagram illustrating a configuration example of the signal conversion unit 9 according to the first embodiment of the present invention.

The signal conversion unit 9 includes a W phase current generation unit 201, a three-phase/two-phase conversion unit 202, a phase calculation unit 203, a coordinate transformation unit 207, and a division unit 208.

The signal conversion unit 9 is a processing block that converts the motor current, which is a two-phase AC signal, into the torque current estimated value and the motor speed estimated value, which are DC amounts. Here, the DC amount refers to a signal having a constant value when there is no change in load. The torque current estimated value and the motor speed estimated value described below can be treated as the DC amounts since fundamental frequency (power supply frequency) of the motor current (phase current), which is an AC amount, has been removed. The power supply frequency is, for example, the frequency of the drive power supply 1, and can be the frequency of the commercial power supply (50 Hz, 60 Hz).

As described above, when the motor current is converted into the DC amount, a mechanical load variation such as vibration is easily extracted. In addition, there is also an advantage that the vibration frequency component can be extracted at the same frequency as in the case of being handled by a vibration sensor. In the case of analyzing the frequency spectrum of a certain signal, it is desirable that the rotational speed (frequency) is constant, that is, it is the DC amount.

First Processing Example of Signal Conversion Unit

First, a conversion processing method using a current phase will be described as a first processing method of the signal conversion unit 9. First, U phase current Iu and V phase current Iv obtained by the current sensors 2 and 3 are input to the W phase current generation unit 201. This is a processing of obtaining three-phase currents in a case where measured current is two phases, and is a processing unnecessary in a case where the currents are obtained in all three phases. The W phase current generation unit 201 performs processing expressed by the following equation (1) to obtain W phase current Iw.

Equation 1

$$Iw = -(Iu + Iv) \quad (1)$$

Next, the three-phase currents are input from the W phase current generation unit 201 to the three-phase/two-phase conversion unit 202, and the three-phase/two-phase conversion unit 202 performs processing expressed by the following equations (2) and (3). Thus, Iα and Iβ are obtained as orthogonal biaxial current components of an α axis and a β axis.

Equation 2

$$I\alpha = (2/3)\{Iu - Iv/2 - Iw/2\} \quad (2)$$

Equation 3

$$I\beta = (1/\sqrt{3})\{Iv - Iw\} \quad (3)$$

Thereafter, the phase calculation unit 203 calculates a phase necessary for performing coordinate transformation (transformation into the DC amount) on the orthogonal biaxial current components of the α axis and the β axis. The phase calculation unit 203 includes an instantaneous phase calculation unit 204, a phase locked loop (PLL) unit 205, and an integration unit 206. Among them, the instantaneous phase calculation unit 204 calculates an instantaneous phase θi* by performing processing represented by the following equation (4).

Equation 4

$$\theta i^* = \tan^{-1}(I\beta/I\alpha) \quad (4)$$

The instantaneous phase θi* is passed through a feedback loop including the PLL unit 205 and the integration unit 206, and a coordinate transformation phase θi is finally generated in the integration unit 206. That is, in the addition unit 209, the instantaneous phase θi* is input to the PLL unit 205 that performs phase synchronization processing after a difference from the coordinate transformation phase θi output from the integration unit 206 is calculated. Then, an output of the PLL unit 205 is input to the integration unit 206 and sequentially added in the integration unit 206. A value of the coordinate transformation phase θi is an estimated value of a rotor position of the motor 4. The PLL unit 205 that performs the phase synchronization processing can also be referred to as a phase storage unit that stores phase information.

Note that in this processing step, the PLL unit 205 obtains an electric speed estimated value (that is, the power supply frequency) Wi. Since this feedback loop has a role of noise removal, if noise (electrical and mechanical noise) of the instantaneous phase θi* is not noticeable, the instantaneous phase θi* may not be passed through the feedback loop described above. For example, when the magnitude of the noise of the instantaneous phase θi* is smaller than a predetermined value, feedback processing is not performed. That is, the addition unit 209, the PLL unit 205, and the integration unit 206 are not required. A configuration of the phase calculation unit 203 is also described in JP 2017-181282 A.

Then, the orthogonal biaxial current components Iα and Iβ of the α axis and the β axis obtained by the three-phase/two-phase conversion unit 202 and the coordinate transformation phase θi obtained by the phase calculation unit 203 are input to the coordinate transformation unit 207, and the coordinate transformation is performed in the coordinate transformation unit 207. The coordinate transformation is processing of obtaining a DC amount Ia of the current for the motor 4 as expressed by the following equation (5). The DC amount Ia is an active current component. A reactive current component Iz is not used here.

Equation 5

$$Ia = I\alpha \cdot \cos(\theta i) + I\beta \cdot \sin(\theta i) \quad (5)$$

The DC amount Ia calculated in this manner and the electric speed estimated value Wi output from the phase calculation unit 203 are DC amounts. Here, the division unit 208 divides the electric speed estimated value Wi by the number of motor poles, to obtain the motor speed (rotational frequency of the motor shaft) estimated value. Further, since the DC amount Ia is similar to a temporal change of the torque current used in motor control, the DC amount Ia is described as the "torque current estimated value" in the present specification. This calculation method assumes an implementation model, and can be employed in any situation even if the motor 4 has a constant speed or a variable speed.

Second Processing Example of Signal Conversion Unit

Next, a second processing method of the signal conversion unit 9 will be described with reference to FIG. 3.

Figure 3:
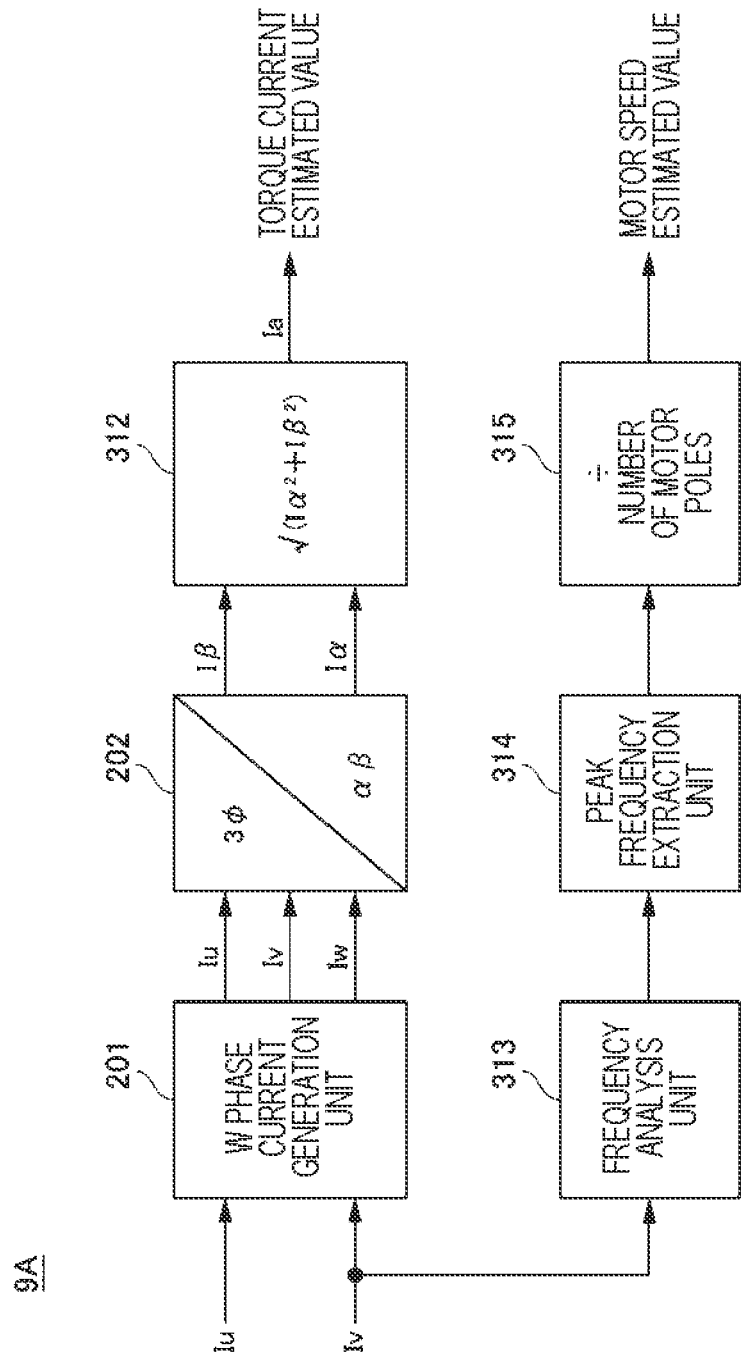
FIG. 3 is a block diagram illustrating another configuration example of the signal conversion unit according to the first embodiment of the present invention.

FIG. 3 is a block diagram illustrating another configuration example of the signal conversion unit 9 according to the first embodiment of the present invention.

A signal conversion unit 9A illustrated in FIG. 3 has the same calculation method as that of the signal conversion unit 9 illustrated in FIG. 2 until Iα and Iβ are calculated by the W phase current generation unit 201 and the three-phase/two-phase conversion unit 202. For calculation of the torque current estimated value, the signal conversion unit 9A performs processing of the following equation (6) using Iα and Iβ in a processing block 312 after the three-phase/two-phase conversion unit 202. That is, a root mean square of Iα and Iβ is calculated.

Equation 6

$$Ia=\sqrt{(I\alpha^2+I\beta^2)} \qquad (6)$$

Figure 4:
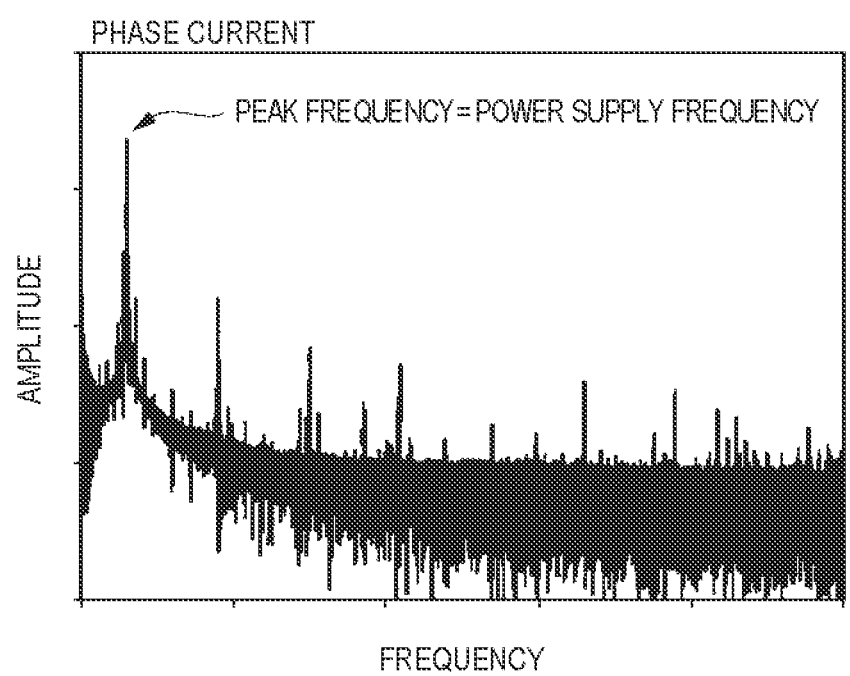
FIG. 4 is a diagram illustrating an example of a waveform obtained by performing frequency analysis of a phase current of a mechanical device (motor)

On the other hand, in calculation of the motor speed estimated value, a signal (signal on a time axis) of one phase of the U phase current Iu or the V phase current Iv is converted into a signal on a frequency axis as illustrated in FIG. 4 in a frequency analysis unit 313. Thus, a peak frequency extraction unit 314 extracts a frequency at which an amplitude has a peak value from the U phase current Iu or the V phase current Iv.

FIG. 4 is a diagram illustrating an example of a waveform obtained by performing frequency analysis of the phase current of the mechanical device 7 (motor 4). In FIG. 4, a horizontal axis represents frequency, and a vertical axis represents amplitude.

Since a peak frequency of the phase current is the frequency of the power supply that drives the motor 4, the motor speed estimated value can be calculated by dividing the peak frequency by the number of motor poles, in the division unit 315. Note that this method is desirably used when the motor 4 is operating at a constant speed. As described above, this is because a fast Fourier transform (FFT) used in the frequency analysis unit 313 increases accuracy of analysis when the rotational speed is constant.

For the configuration and operation of the signal conversion unit 9 that converts the AC amount into the DC amount as the current information on the motor 4, for example, a well-known technique as described in JP 2017-181282 A can be used.

Calculation Management Unit

Next, the calculation management unit 10 will be described with reference to FIG. 5.

The calculation management unit 10 is a block that controls processing of the diagnostic frequency estimation unit 8, and manages calculation steps and information necessary for calculation.

Figure 5:
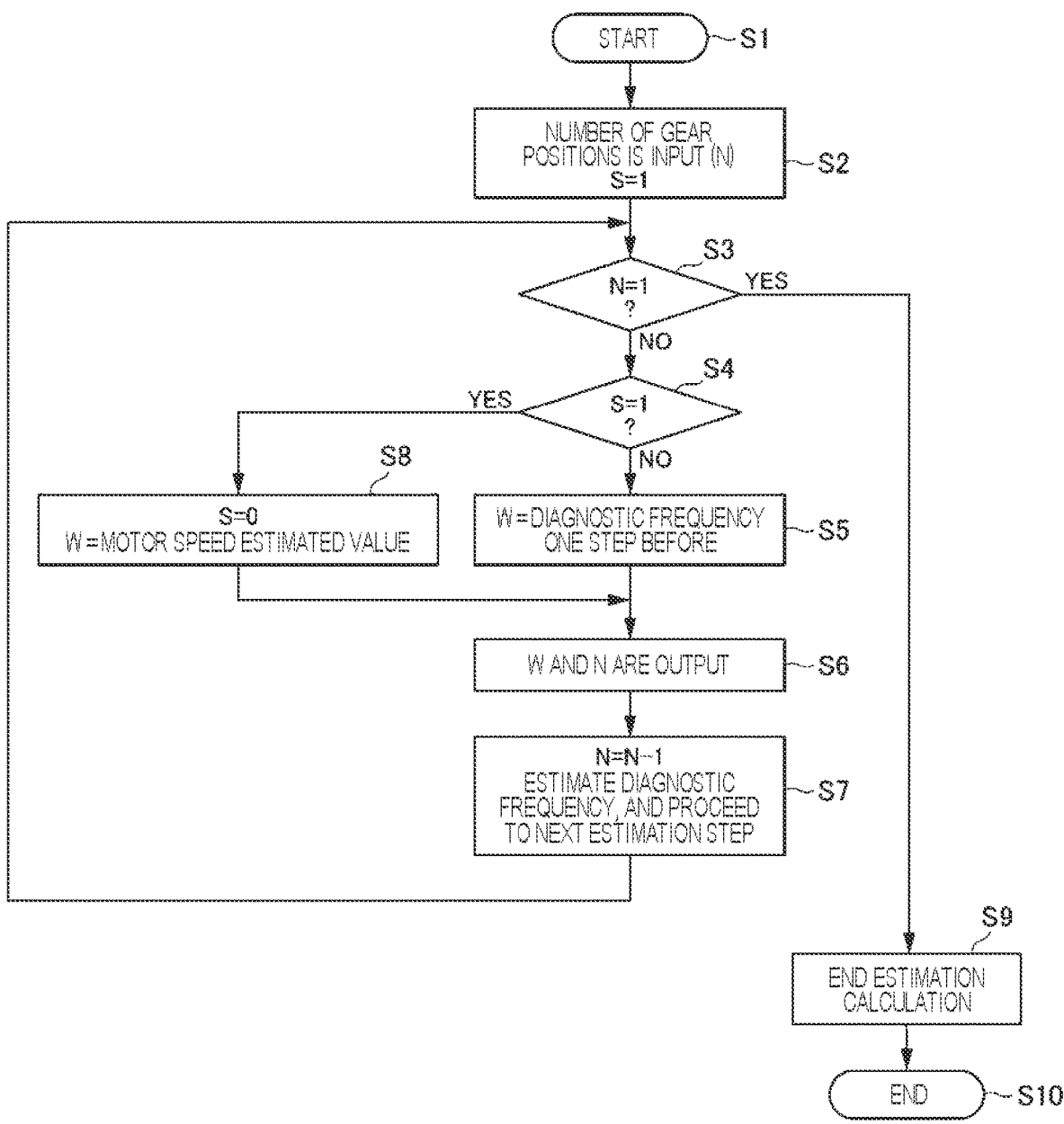
FIG. 5 is a flowchart illustrating a procedure example of processing by a calculation management unit according to the first embodiment of the present invention.

FIG. 5 is a flowchart illustrating a procedure example of processing by the calculation management unit 10. When the calculation is started in the calculation management unit 10 for the first time (step S1), information on the number of gear positions of the transmission device 5 is input to a variable N (step S2). At that time, the calculation management unit 10 sets a flag S indicating a first estimation calculation to 1.

Here, the transmission device 5 will be described with reference to FIG. 6.

Figure 6:
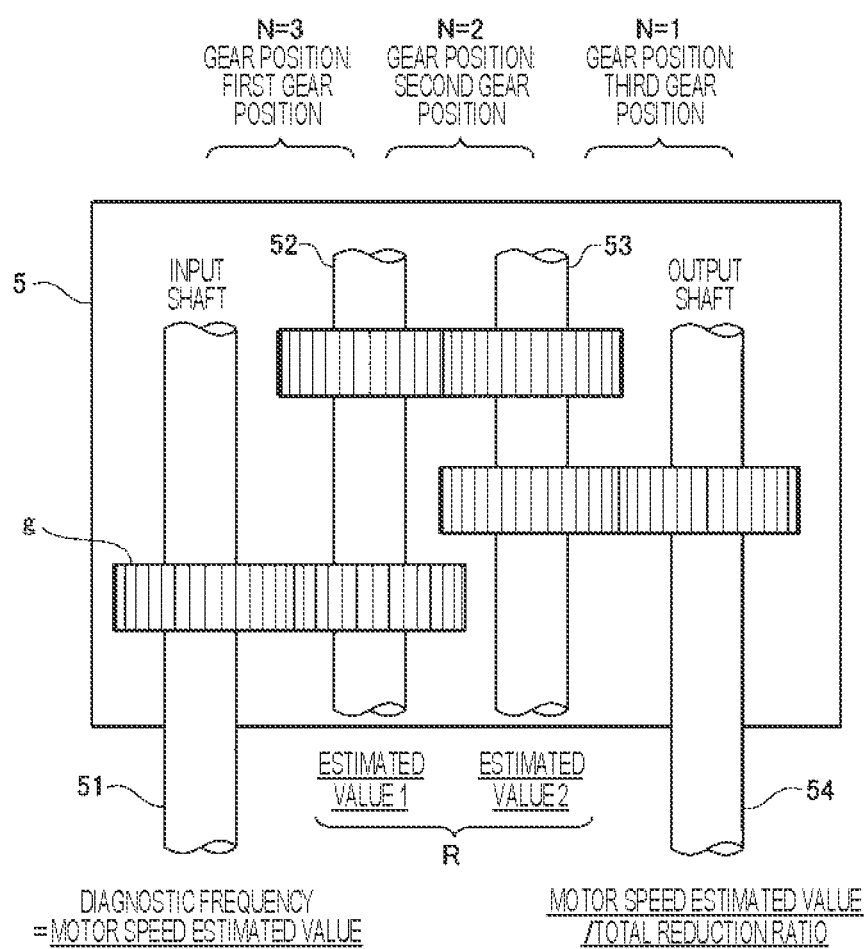
FIG. 6 is a diagram illustrating a configuration example of a transmission device.

FIG. 6 is a diagram illustrating a configuration example of the transmission device 5.

Here, considering estimation of the frequencies of the rotating shafts 51 to 54 of the transmission device 5 illustrated in FIG. 6 as an example, the number of gear positions N is three (three shifts). The gear positions are counted from the output shaft side. Since a pre-shift gear and a post-shift gear having different numbers of teeth mesh with each other and rotate in each gear position, rotational frequencies of the rotating shafts 52 to 54 change.

Next, the calculation management unit 10 checks whether the number of stages N is 1 (step S3). Here, since N=3, NO is determined in step S3, and the process proceeds to step S4.

Next, the calculation management unit 10 checks by the flag S whether the calculation is a first calculation (step S4). At present, since the flag S is 1, YES is determined in step S4. Next, in step S8, the calculation management unit 10 sets the flag S to 0, and sets the pre-shift input frequency W to be input to the diagnostic frequency candidate extraction unit 11 to the motor speed estimated value estimated by the signal conversion unit 9 (step S8).

Here, when described with reference to FIG. 6, the input frequency W is a step of calculating the frequency of the rotating shaft 52 (a second shaft from the left) after current first shift, and the input frequency W used at that time is the frequency of the rotating shaft 51 before shift, that is, the motor speed estimated value. Therefore, in step S8, the motor speed estimated value is set to the input frequency W.

Then, after processing of step S8, the calculation management unit 10 outputs the input frequency W and the number of stages N (step S6). Next, in step S7, the calculation management unit 10 updates the number of stages N (N=N−1), and the diagnostic frequency candidate extraction unit 11 estimates the diagnostic frequency (referring to FIG. 6, an estimated value 1). After processing of step S7, the process returns to step S3.

In a second loop (estimation of the frequency of the third rotating shaft 53 third from the left in FIG. 6), since N=2 and S=0, the process proceeds to step S5 through NO determinations in steps S3 and S4. Here, the calculation management unit 10 sets the diagnostic frequency (since the rotational frequency of the third shaft from the left is currently estimated, the estimated value 1 in FIG. 6 is the diagnostic frequency one step before) calculated one step before to the input frequency W.

Then, the calculation management unit 10 proceeds to steps S6 and S7 to update the number of stages N (N=N−1), and the diagnostic frequency candidate extraction unit 11 estimates the diagnostic frequency (an estimated value 2 in FIG. 6). After processing of step S7, the process returns to step S3.

Then, in a third loop, since N=1, the calculation management unit 10 determines YES in step S3, and ends the estimation of the diagnostic frequency by the diagnostic frequency candidate extraction unit 11 (step S9). After step S9 ends, this flowchart ends (step S10). Note that the rotational frequencies of the input shaft (rotating shaft 51) and the output shaft (rotating shaft 54) of the transmission device 5 can be calculated from the motor speed estimated value and the total gear ratio (total reduction ratio), and thus the diagnostic frequency candidate extraction unit 11 does not perform the estimation calculation.

Diagnostic Frequency Candidate Extraction Unit

Subsequently, the diagnostic frequency candidate extraction unit 11 will be described with reference to FIG. 7.

Figure 7:
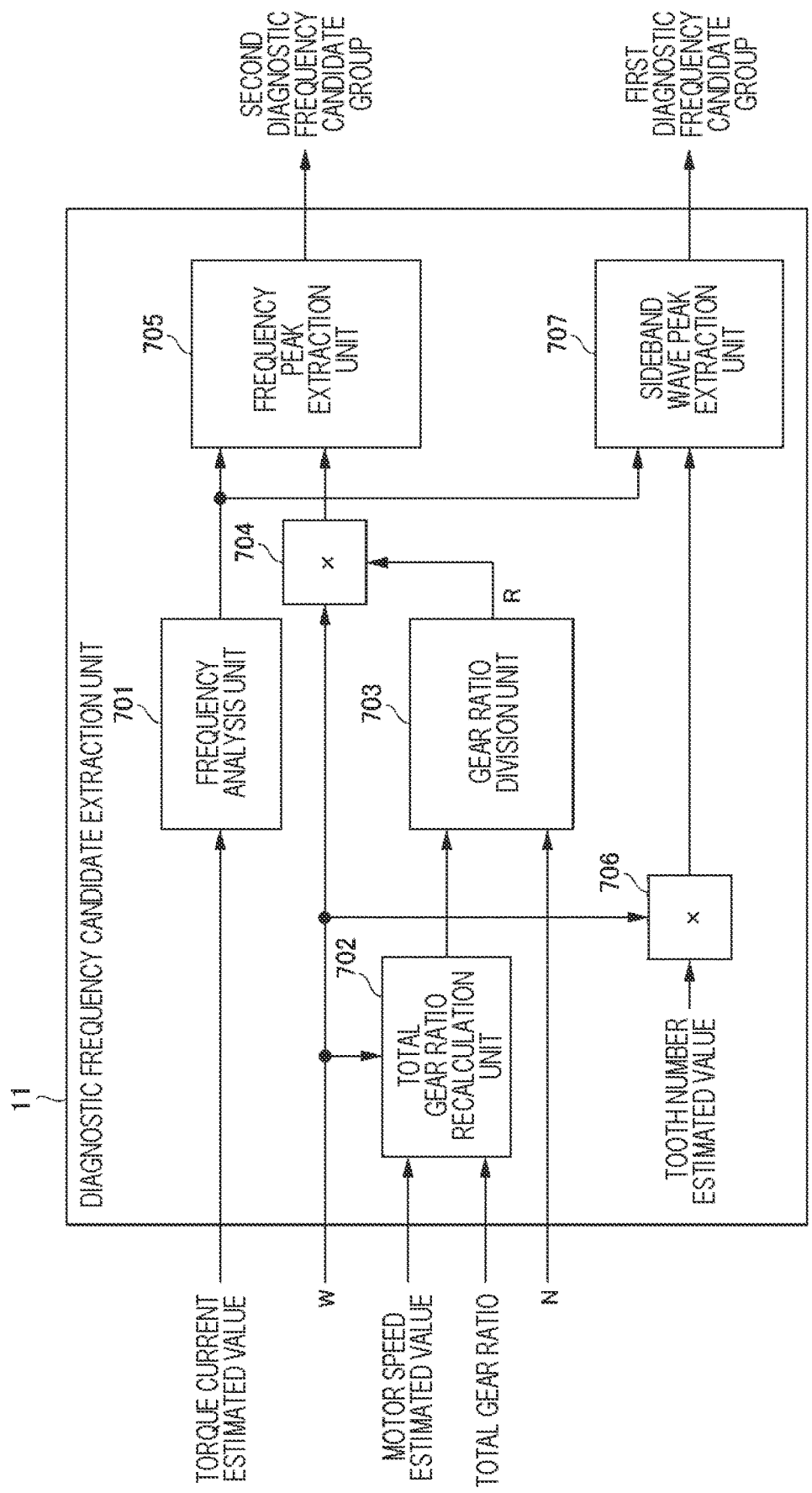
FIG. 7 is a block diagram illustrating a configuration example of a diagnostic frequency candidate extraction unit according to the first embodiment of the present invention.

FIG. 7 is a block diagram illustrating a configuration example of the diagnostic frequency candidate extraction unit 11 according to the first embodiment of the present invention.

The diagnostic frequency candidate extraction unit 11 extracts the diagnostic frequency candidate group using two different methods. Although details of the different methods will be described later, a point is to use a principle that since the rotating shafts 51 to 54 always rotates with minute misalignment and eccentricity, in a mechanism having gears, the influence appears in both the rotational frequency and a sideband wave of the meshing frequency.

As illustrated in FIG. 7, the diagnostic frequency candidate extraction unit 11 includes a frequency analysis unit 701, a total gear ratio recalculation unit 702, a gear ratio division unit 703, a multiplication unit 704, a frequency peak extraction unit 705, a multiplication unit 706, and a sideband wave peak extraction unit 707.

First, the torque current estimated value input to the diagnostic frequency candidate extraction unit 11 is input to the frequency analysis unit 701, and is converted from time axis information to frequency axis information using a method such as fast Fourier transform (FFT). The frequency axis information of the torque current estimated value, that is, the frequency spectrum information is input from the frequency analysis unit 701 to the frequency peak extraction unit 705.

Next, information of the pre-shift input frequency W, the motor speed estimated value, and the total gear ratio is input to the total gear ratio recalculation unit 702. The total gear ratio recalculation unit 702 recalculates the total gear ratio from the gear position in which current diagnostic frequency is to be estimated to a final gear position.

Describing by taking FIG. 6 as an example, for example, when the rotational frequency of the third rotating shaft 53 from the left is currently estimated, a multiplication value of the gear ratio of the second gear position and the gear ratio of the third gear position is a new total gear ratio. On the other hand, when the rotational frequency of the second rotating shaft 52 from the left is estimated, the total gear ratio itself input to the diagnostic frequency candidate extraction unit 11 may be used. Therefore, the total gear ratio is recalculated as in the following equation (7).

Equation 7

$$\text{Recalculated total gear ratio} = \text{Total gear ratio}/(W/\text{motor speed estimated value}) \quad (7)$$

The total gear ratio recalculated as described above is input from the total gear ratio recalculation unit 702 to the gear ratio division unit 703 together with the number of stages N indicating which gear position counting from the output shaft is calculated. Then, a gear ratio R of the current gear position is estimated from the recalculated total gear ratio. That is, gear ratio division is a part of the total gear ratio of the transmission device 5 and represents a component (the gear ratio R) obtained by dividing the total gear ratio. As the calculation method, for example, a candidate of the gear ratio R per stage may be held as a table from a relationship between the recalculated total gear ratio and the number of stages N, and the table may be used. For example, the table is stored in a non-volatile memory (not illustrated) or the like included in the gear ratio division unit 703 or the diagnostic frequency candidate extraction unit 11.

Then, the gear ratio R calculated by the gear ratio division unit 703 is multiplied by the input frequency W in the multiplication unit 704, and is input to the frequency peak extraction unit 705 together with an analysis result of the frequency analysis unit 701. Output of the multiplication unit 704 corresponds to the rotational frequency of the post-shift rotating shaft of a current targeted gear position. Note that a value of the gear ratio R output from the gear ratio division unit 703 may not be single, and the gear ratio R may be values in a certain range.

The frequency peak extraction unit 705 searches a numerical value calculated by the multiplication unit 704 from the frequency spectrum calculated by the frequency analysis unit 701. As a method, for example, one or a plurality of frequency peaks present in a width of ±10% of an output value of the multiplication unit 704 may be extracted. In addition, when the gear ratio R is calculated in a certain range in the gear ratio division unit 703, one or a plurality of frequency peaks within the range may be extracted, and the extraction result is output as the second diagnostic frequency candidate group.

On the other hand, the input frequency W is also input to the multiplication unit 706 and is multiplied by a tooth number estimated value of the gear on the input side of the gear position currently being calculated. This corresponds to calculating the frequency of the meshing vibration (an example of mechanical vibration) generated from the gear. At this time, the tooth number estimated value may be calculated in advance from design values or the like of a plurality of transmission devices and stored in a non-volatile memory (not illustrated) included in the diagnostic frequency candidate extraction unit 11 or the like. In addition, the tooth number estimated value may not be single, and may be values in a certain range.

An output result from the multiplication unit 706 and an output result (the frequency spectrum of the torque current estimated value) from the frequency analysis unit 701 are input to the sideband wave peak extraction unit 707. The sideband wave peak extraction unit 707 first searches for the meshing frequency from the frequency spectrum of the torque current estimated value. As a search method, a maximum peak within a range of, for example, ±10% of the output value of the multiplication unit 706 is searched. At this time, the sideband wave peak extraction unit 707 may search for the maximum peak with a plurality of conditions as AND conditions, such as those that are not harmonics of electrical noise, and when the output value of the multiplication unit 706 is in a certain range, the maximum peak may be searched for within the range using the above plurality of conditions. Then, the sideband wave peak extraction unit 707 extracts the peak frequency present in a sideband wave (for example, within a range of ±10% of the meshing frequency) having a determined meshing frequency, and outputs the extracted peak frequency as the first diagnostic frequency candidate group. Note that the number of frequencies to be extracted may be one or more. In addition, conditions of the frequency to be extracted from the sideband wave of the meshing frequency are set through a test or the like in advance in a non-volatile memory (not illustrated) or the like included in the sideband wave peak extraction unit 707 or the diagnostic frequency candidate extraction unit 11.

Diagnostic Frequency Selection Unit

Next, the diagnostic frequency selection unit 12 will be described with reference to FIG. 7.

The diagnostic frequency selection unit 12 (FIG. 1) compares a frequency (second diagnostic frequency candidate) included in the second diagnostic frequency candidate group output from the diagnostic frequency candidate extraction unit 11 with a frequency obtained by subtracting the above-described meshing frequency from the first diagnostic frequency candidate group and taking an absolute value, and outputs a frequency at which a specific relationship is established between the two diagnostic frequency candidate groups as the diagnostic frequency. At two frequencies at which this specific relationship is established, a relationship of "frequency difference $\Delta f$=meshing frequency−(second diagnostic frequency candidate)×2" or "frequency difference $\Delta f$=meshing frequency" is established.

As described above, one of the following relationships is established for the frequency difference Δf (specific frequency).

Frequency difference Δf=meshing frequency of meshing gear of transmission device 5−(frequency extracted from second diagnostic frequency candidate group×2)

Frequency difference Δf=meshing frequency of meshing gear

Thus, the diagnostic frequency selection unit 12 can extract a plurality of diagnostic frequency candidate groups from a frequency region separated by the frequency difference Δf (specific frequency) or more, and estimate a frequency satisfying the specific relationship from frequencies obtained in the plurality of diagnostic frequency candidate groups as the diagnostic frequency.

Figure 14:
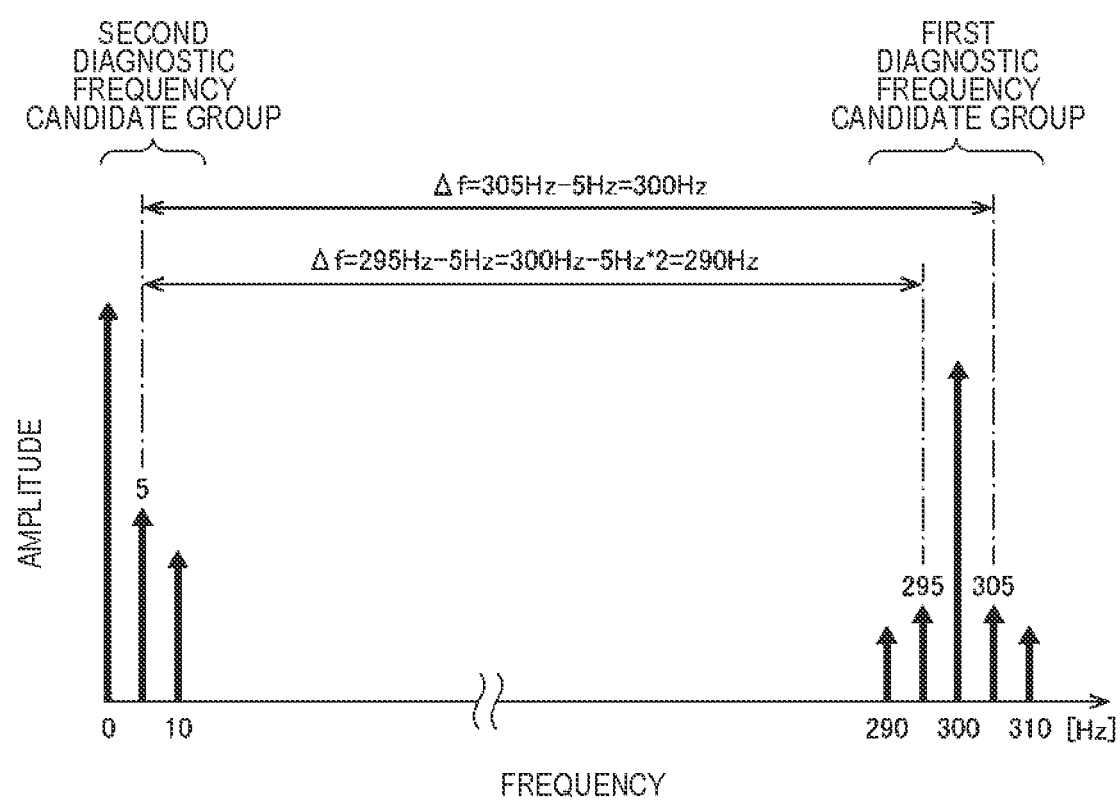
FIG. 14 is a diagram illustrating an example of a frequency spectrum of a torque current estimated value including a first diagnostic frequency candidate group and a second diagnostic frequency candidate group.

Frequency Spectrum Including First Diagnostic Frequency Candidate Group and Second Diagnostic Frequency Candidate Group FIG. 14 is a diagram illustrating an example of the frequency spectrum of the torque current estimated value including the first diagnostic frequency candidate group and the second diagnostic frequency candidate group. FIG. 14 illustrates the example of the frequency spectrum of the torque current estimated value when a specific numerical value is applied to the mechanical device 7.

FIG. 14 illustrates only the frequency spectrum of a first gear position when the total gear ratio is 1/4 and the gear ratio of each gear position is 1/2 in two step transmission. That is, this transmission device includes the input shaft, the output shaft, and a rotating shaft disposed therebetween. Further, it is assumed that the number of teeth of the gear of the input shaft is 30, the number of teeth of the gear meshing with the gear of the input shaft is 60, the rotational speed of the input shaft is 10 Hz, the rotational speed of the rotational shaft meshing with the input shaft after shifting is 5 Hz, and the meshing frequency of the first gear position is 300 Hz.

When the present embodiment is applied to the mechanical device 7 under such conditions, 5 Hz is selected from the second diagnostic frequency candidate group and 295 Hz or 305 Hz is selected from the first diagnostic frequency candidate group in the diagnostic frequency selection unit 12. That is, it can be seen that the difference (specific frequency) between frequencies respectively extracted from the first and second diagnostic frequency candidate groups has the relationship described above. Then, the diagnostic frequency selection unit 12 selects 5 Hz extracted from the second diagnostic frequency candidate group as the diagnostic frequency of the rotating shaft meshing with the input shaft, and outputs the diagnostic frequency to the abnormality diagnosis unit 15.

As described above, the diagnostic frequency selection unit 12 selects a frequency satisfying the specific relationship from the frequencies included in the second diagnostic frequency candidate group as the diagnostic frequency. Thus, the diagnostic frequency selection unit 12 can accurately and automatically select the diagnostic frequency from the second diagnostic frequency candidate group extracted by the diagnostic frequency candidate extraction unit 11 using two completely different phenomena that the mechanical influence appears in both the rotational frequency and the sideband wave of the meshing frequency in the mechanism having the gears.

Further, as described in a specific example, in the present embodiment, when the frequency candidate groups are two, the first diagnostic frequency candidate group includes one or more frequencies extracted from "the sideband wave of the meshing frequency (for example, 300 Hz) of the meshing gear of the transmission device 5". Further, the second diagnostic frequency candidate group includes one or more frequencies (for example, 5 Hz) extracted from "other than the sideband wave of the meshing frequency (for example, 300 Hz) of the meshing gear of the transmission device 5".

Abnormality Diagnosis Unit

Finally, the abnormality diagnosis unit 15 will be described.

The abnormality diagnosis unit 15 performs abnormality diagnosis (for example, calculation of the degree of abnormality) of the transmission device 5 using the diagnostic frequency estimated by the diagnostic frequency estimation unit 8. In the abnormality diagnosis, for example, it is conceivable that an amplitude component of the diagnostic frequency is input to a model prepared in advance to calculate an evaluation value (a continuous value or a discrete value) indicating an abnormal state, or a result (for example, the degree of abnormality) obtained by directly comparing the amplitude component with a threshold is output. When the model is used, a model in which a normal state is learned or a model in which an abnormal state and a normal state are learned is considered, and the model is constructed using a regression model, a classification model, a cluster model, a neural network, or the like.

Further, as the amplitude component of the diagnostic frequency described above, an amplitude component of a frequency obtained by multiplying the diagnostic frequency by a coefficient may be used. The coefficient may be, for example, a numerical value due to a shape of a bearing of the rotating shaft, the number of teeth of the gear, or the like, or an integer value or a fractional value may be multiplied to the diagnostic frequency. Further, the abnormality diagnosis unit 15 may use a plurality of input values of the diagnostic frequency or may use them alone. In addition, there may be a plurality of models for calculating the degree of abnormality, for example, respectively for diagnostic sites of an object to be diagnosed (here, the transmission device 5).

According to the transmission device monitoring system 100 according to the first embodiment configured as described above, it is possible to accurately and automatically estimate the vibration frequency component for diagnosing the abnormality of the rotating component (transmission device 5) from the motor current on which the mechanical and electrical noises are superimposed only by the motor current and the information on the total gear ratio, the number of gear positions, and the number of motor poles. Furthermore, the transmission device monitoring system according to the present embodiment can be expected to improve diagnostic accuracy and reduce the time required to construct the transmission device monitoring system by using the diagnostic frequency component.

Second Embodiment

In a second embodiment of the present invention, the transmission device monitoring system for calculating the degree of abnormality by estimating the vibration frequency (diagnostic frequency) necessary for the diagnosis of the rotating component on the basis of one phase motor current and information on the total gear ratio and the number of gear positions of the mechanical device 7, and the number of poles of the motor 4 will be described.

Configuration of Transmission Device Monitoring System

Figure 8:
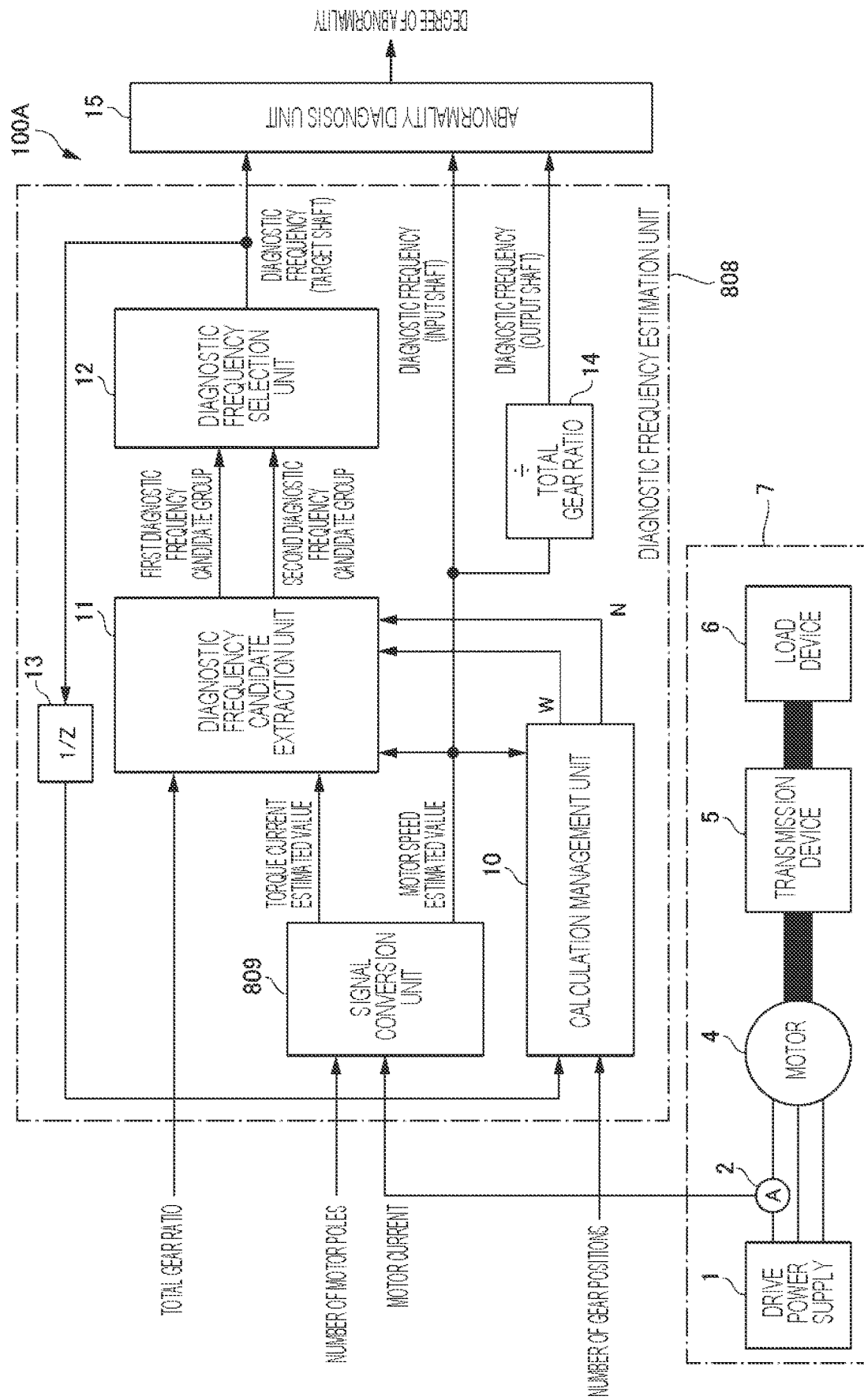
FIG. 8 is a block diagram illustrating the configuration example of the transmission device monitoring system according to a second embodiment of the present invention.

FIG. 8 is a block diagram illustrating the configuration example of the transmission device monitoring system according to the second embodiment of the present invention.

In the second embodiment, for the same configuration and processing as those of the first embodiment, the redundant description will be omitted. A difference between a transmission device monitoring system 100A according to the second embodiment and the transmission device monitoring system 100 (FIG. 1) according to the first embodiment is that only one phase of the motor current is used as the current information on the motor 4. Therefore, the transmission device monitoring system 100A includes a signal conversion unit 809 instead of the signal conversion unit 9. In the present embodiment, it is assumed that the U phase current Iu is obtained by a current sensor 2. Note that the phase of the current to be obtained may be any of the U phase, the V phase, and the W phase. The obtained motor current is input to the signal conversion unit 809.

Signal Conversion Unit

Next, details of the signal conversion unit 809 will be described with reference to FIG. 9.

Figure 9:
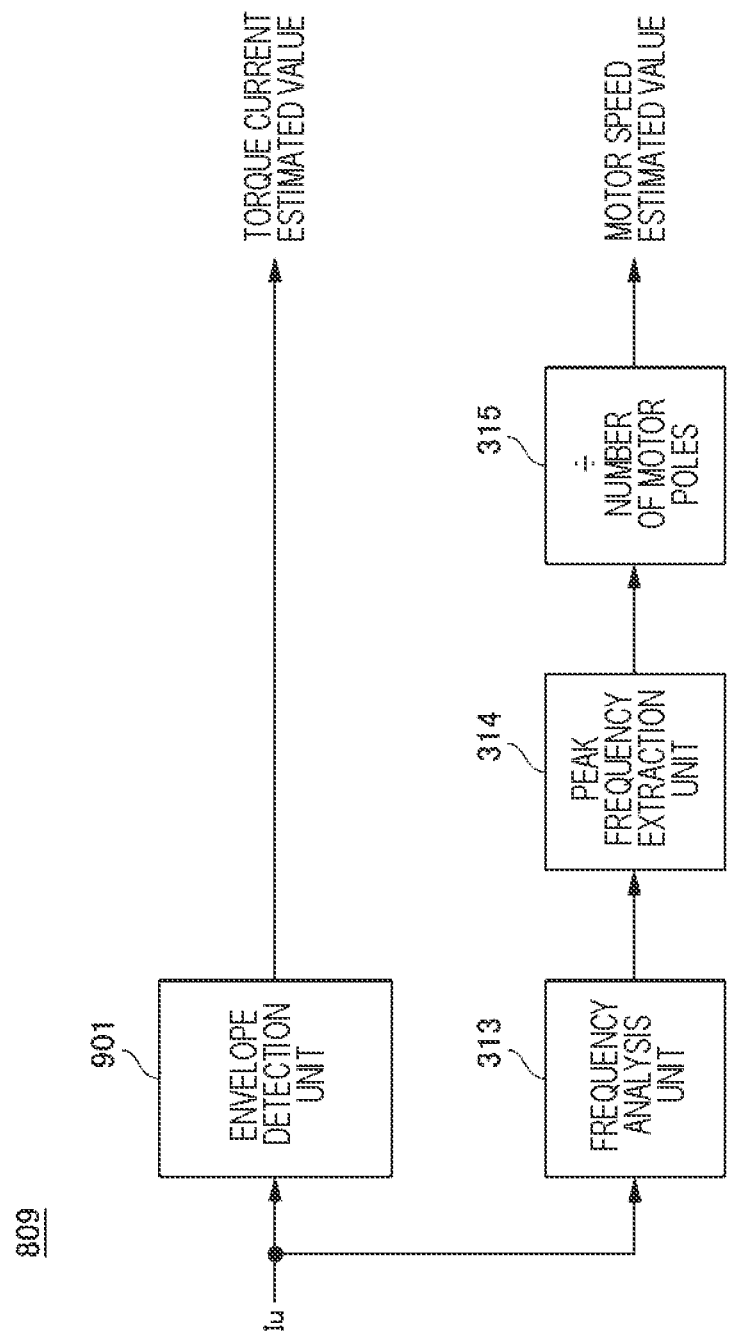
FIG. 9 is a block diagram illustrating the configuration example of the signal conversion unit according to the second embodiment of the present invention.

FIG. 9 is a block diagram illustrating the configuration example of the signal conversion unit 809 according to the second embodiment of the present invention.

As in the case of the first embodiment, the signal conversion unit 809 performs processing of calculating the torque current estimated value and the motor speed estimated value. The input U phase current Iu is input to an envelope detection unit 901, and the torque current estimated value is calculated.

Examples of an envelope processing method include Hilbert transform. A value obtained by performing envelope processing on the phase current becomes a DC amount by removing an AC component that alternately takes a positive value and a negative value, and changes like the torque current. Accordingly, the value obtained by performing envelope processing on the phase current can be treated as the torque current estimated value. On the other hand, since the calculation of the motor speed estimated value is similar to the method by the signal conversion unit 9 illustrated in FIG. 3, description thereof will be omitted.

According to a transmission device monitoring system 100A according to the second embodiment described above, since the number of current sensors can be reduced as compared with the first embodiment, it is possible to suppress the cost required for constructing the transmission device monitoring system.

Third Embodiment

In a third embodiment of the present invention, another transmission device monitoring system for calculating the degree of abnormality by estimating the vibration frequency (diagnostic frequency) necessary for the diagnosis of the rotating component on the basis of the one phase motor current and the information on the total gear ratio and the number of gear positions of the mechanical device 7, and the number of poles of the motor 4 will be described. That is, the third embodiment can also be said to be a modification of the second embodiment.

Configuration of Transmission Device Monitoring System

Figure 10:
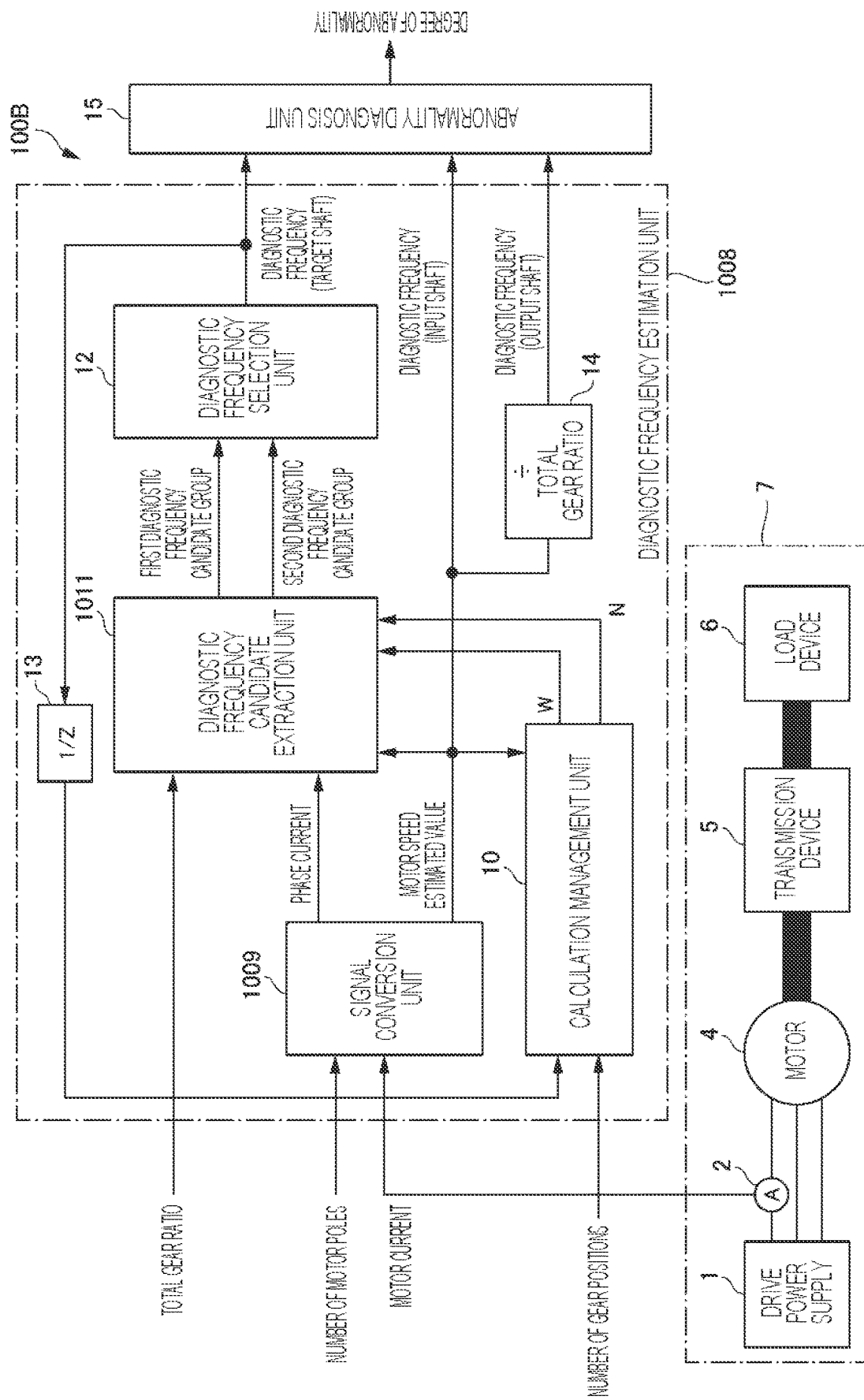
FIG. 10 is a block diagram illustrating the configuration example of the transmission device monitoring system according to a third embodiment of the present invention.

FIG. 10 is a block diagram illustrating the configuration example of the transmission device monitoring system according to the third embodiment of the present invention.

In the third embodiment, for the same configuration and processing as those of the first and second embodiments, the redundant description will be omitted. There are two differences between a transmission device monitoring system 100B according to the third embodiment and the transmission device monitoring systems 100 and 100A according to the first embodiment and the second embodiment. A first difference is that the phase current itself is output from a signal conversion unit 1009 instead of the torque current estimated value, and a second difference is that the processing method of a diagnostic frequency candidate extraction unit 1011 is different.

Signal Conversion Unit

Next, details of the signal conversion unit 1009 will be described with reference to FIG. 11.

Figure 11:
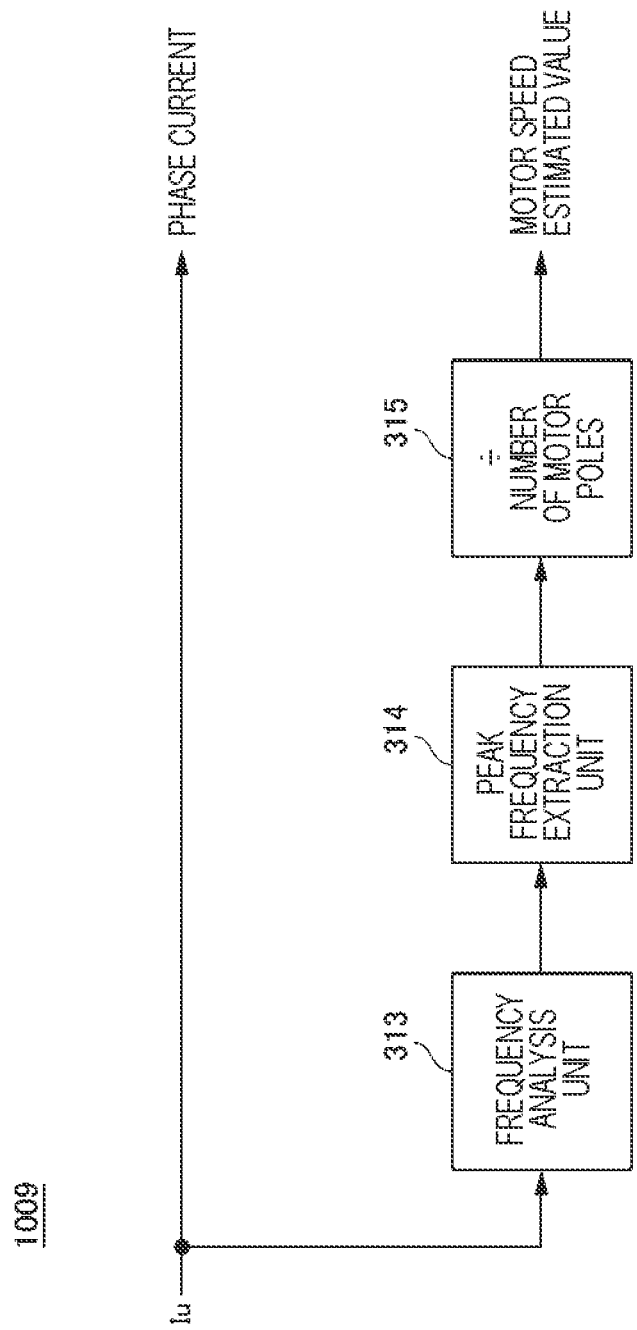
FIG. 11 is a block diagram illustrating the configuration example of the signal conversion unit according to the third embodiment of the present invention.

FIG. 11 is a block diagram illustrating the configuration example of the signal conversion unit 1009 according to the third embodiment of the present invention.

The signal conversion unit 1009 outputs the phase current as it is without performing processing of converting the motor current into the DC amount as in the first and second embodiments. FIG. 11 illustrates a configuration in which the U phase current Iu obtained by the current sensor 2 is directly output to the diagnostic frequency candidate extraction unit 1011.

Diagnostic Frequency Candidate Extraction Unit

Next, the diagnostic frequency candidate extraction unit 1011 will be described with reference to FIG. 12.

Figure 12:
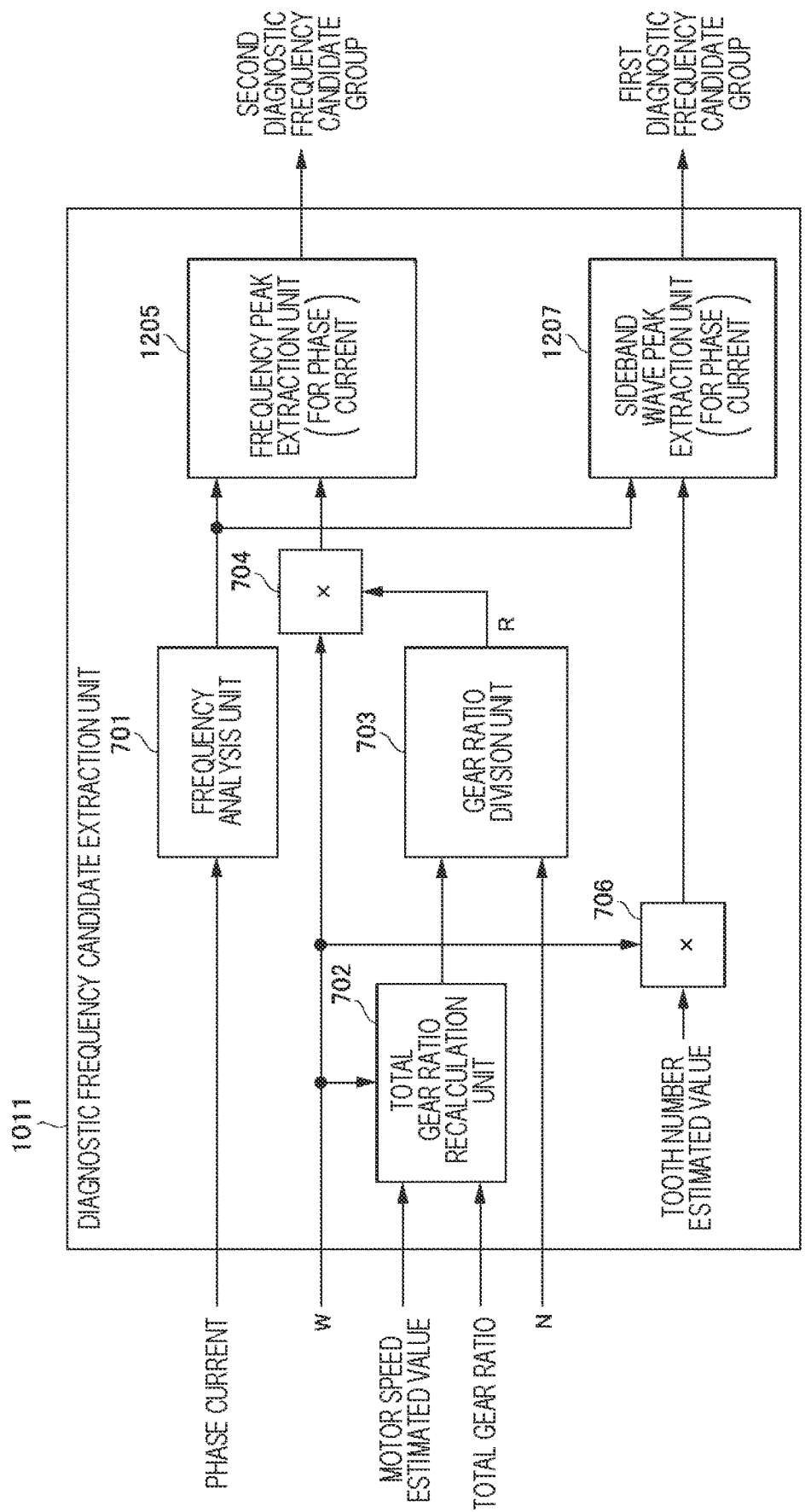
FIG. 12 is a block diagram illustrating the configuration example of the diagnostic frequency candidate extraction unit according to the third embodiment of the present invention.

FIG. 12 is a block diagram illustrating the configuration example of the diagnostic frequency candidate extraction unit 1011 according to the third embodiment of the present invention.

As illustrated in FIG. 12, the diagnostic frequency candidate extraction unit 1011 to which the phase current is input performs processing similar to that of the first embodiment except for a frequency peak extraction unit (for phase current) 1205 and a sideband wave peak extraction unit (for phase current) 1207.

Since a search target is the frequency spectrum of the phase current, the frequency peak extraction unit 1205 performs a search using a value obtained by adding the power supply frequency to a value output from the multiplication unit 704. As described above, an output of the multiplication unit 704 corresponds to the rotational frequency of the post-shift rotating shaft of the current targeted gear position. In addition, the sideband wave peak extraction unit 1207 also performs a search using a value obtained by adding the power supply frequency to a value output from the multiplication unit 706. That is, the information on the frequency axis of FIG. 14 described in the first embodiment also appears in a form shifted by the power supply frequency.

For example, in the first embodiment, the frequency peak extraction unit 705 (FIG. 7) selects "5 Hz" extracted from the second diagnostic frequency candidate group illustrated in FIG. 14 as the vibration frequency. Assuming that the power supply frequency is 50 Hz, the power supply frequency of 50 Hz is added to 5 Hz to obtain "55 Hz". In addition, in FIG. 14, the meshing frequency "300 Hz" is illustrated as an example of the frequency of the first diagnostic frequency candidate group. When the meshing frequency is 300 Hz, the power supply frequency of 50 Hz is added and illustrated as "350 Hz".

According to the transmission device monitoring system 100B according to the third embodiment described above, since the number of current sensors can be reduced as compared with the first embodiment, it is possible to suppress the cost required for constructing the transmission device monitoring system. Furthermore, the present embodiment can simplify signal conversion processing as compared with the second embodiment. Therefore, a processing load of the transmission device monitoring system can be reduced.

According to the transmission device monitoring systems 100, 100A, and 100B according to the first to third embodiments described above, the signal conversion units 9, 809, and 1009 can obtain the current information (motor current) on the motor 4 from the current sensor installed in at least one phase of the motor 4 and perform diagnosis.

Further, as described in a specific example, in the present embodiment, when the frequency candidate groups are two, the first diagnostic frequency candidate group includes one or more frequencies extracted from "a sideband wave of a frequency obtained by adding the power supply frequency (for example, 50 Hz) of the drive power supply 1 of the motor 4 to the meshing frequency (for example, 300 Hz) of the meshing gear of the transmission device 5". Further, the second diagnostic frequency candidate group includes one or more frequencies (for example, 55 Hz) extracted from "other than the sideband wave of the frequency obtained by adding the power supply frequency (for example, 50 Hz) of the drive power supply 1 of the motor 4 to the meshing frequency (for example, 300 Hz) of the meshing gear of the transmission device 5".

Fourth Embodiment

In a fourth embodiment of the present invention, the transmission device monitoring system for calculating the degree of abnormality by estimating the vibration frequency (diagnostic frequency) necessary for the diagnosis of the rotating component on the basis of information on the torque current, the total gear ratio and the number of gear positions of the mechanical device, and motor speed will be described.

Configuration of Transmission Device Monitoring System

Figure 13:
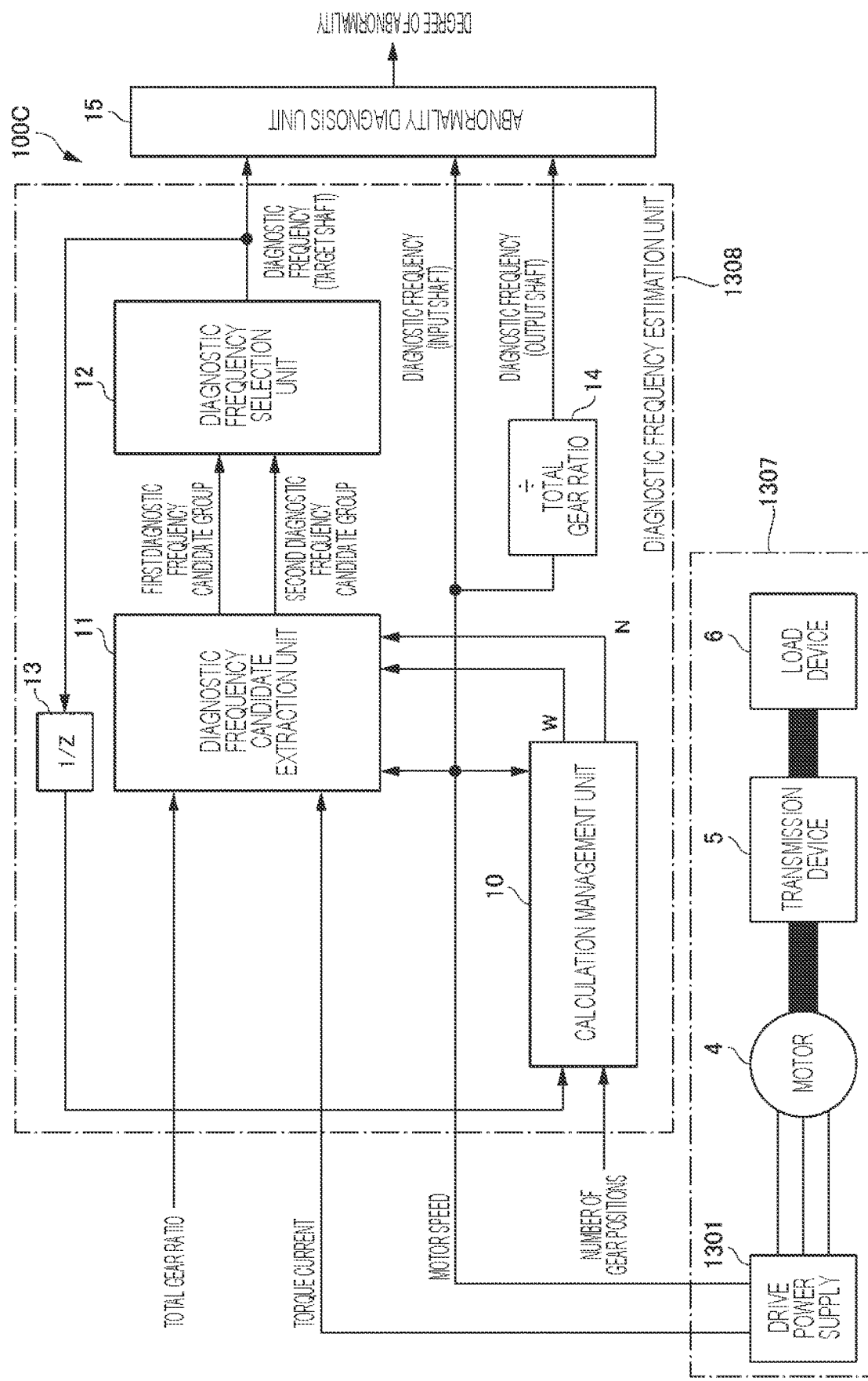
FIG. 13 is a block diagram illustrating the configuration example of the transmission device monitoring system according to a fourth embodiment of the present invention.

FIG. 13 is a block diagram illustrating the configuration example of the transmission device monitoring system according to a fourth embodiment of the present invention.

In the fourth embodiment, for the same configuration and processing as those of the first to third embodiment, the redundant description will be omitted. A transmission device monitoring system 100C according to the fourth embodiment is different from the transmission device monitoring systems 100 to 100B according to the first to third embodiments in that information on the torque current that is already a DC value and the motor speed is obtained from a drive power supply 1301 (an inverter) as the current information on the motor 4. The drive power supply 1301 of a mechanical device 1307 has the same configuration as that of the drive power supply 1 (FIG. 1) except that the information on the torque current and the motor speed is output to the diagnostic frequency candidate extraction unit 11.

Therefore, in the present embodiment, the signal conversion units 9, 809, and 1009 present in the transmission device monitoring systems 100 to 100B according to the first to third embodiments are not required. The information on the torque current is directly input from the drive power supply 1301 to the diagnostic frequency candidate extraction unit 11. Further, the information on the motor speed is directly input from the drive power supply 1301 to the diagnostic frequency candidate extraction unit 11, the calculation management unit 10, the division unit 14, and the abnormality diagnosis unit 15. Note that contents of other processing blocks are the same as the contents described in the first embodiment and the second embodiment, and thus the description thereof will be omitted.

According to the transmission device monitoring system 100C according to the fourth embodiment described above, the number of current sensors can be reduced as compared with the first to third embodiments, and it is possible to reduce the processing load of the transmission device monitoring system.

Summary of First to Fourth Embodiments

As described above, the transmission device monitoring system according to the first to fourth embodiments of the present invention is a transmission device monitoring system that monitors the transmission device driven by the motor, and includes the diagnostic frequency estimation unit and the abnormality diagnosis unit.

The diagnostic frequency estimation unit is configured to extract the plurality of diagnostic frequency candidate groups from the frequency region separated by the specific frequency (frequency difference $\Delta f$) or more using at least the current information on the motor, the gear ratio of the transmission device, and the number of stages of the transmission device, and estimate the frequency satisfying the specific relationship from the frequencies obtained in the plurality of diagnostic frequency candidate groups as the diagnostic frequency.

The abnormality diagnosis unit is configured to diagnose the abnormality of the transmission device using at least the one diagnostic frequency estimated by the diagnostic frequency estimation unit.

According to the transmission device monitoring systems according to the first to fourth embodiments described above, it is possible to accurately and automatically estimate the vibration frequency component for diagnosing the abnormality of the rotating component of the transmission device from the current information (motor current, torque current, and the like) on the motor in which the mechanical and electrical vibrations are compositely superimposed. Furthermore, the transmission device monitoring systems according to the embodiments can be expected to improve the diagnostic accuracy and reduce the time required to construct the transmission device monitoring system by using the diagnostic frequency component.

Modification

Note that the present invention is not limited to the above-described embodiments, and it goes without saying that various other application examples and modifications can be taken without departing from the gist of the present invention described in the claims.

For example, the above-described embodiments describe the configuration of the monitoring system in detail and specifically in order to describe the present invention in an easy-to-understand manner, and are not necessarily limited to those including all the described components. Further, a part of the configuration of one embodiment can be replaced with a component of another embodiment. Further, a component of another embodiment can be added to the configuration of one embodiment. Furthermore, it is also possible to add, replace, or delete another component for a part of the configuration of each embodiment.

Further, in the above-described embodiments, control lines and information lines considered to be necessary for description are illustrated, and not all control lines and information lines are necessarily illustrated in products. In practice, it may be considered that almost all the components are connected to each other.

Further, some or all of the configurations, functions, processing units, and the like described in the embodiments may be realized by hardware, for example, by designing with an integrated circuit. A processor device in a broad sense such as a field programmable gate array (FPGA) or an application specific integrated circuit (ASIC) may be used as the hardware. Furthermore, in the transmission device monitoring system according to the above-described embodiments, the processing performed by a certain processing unit may be implemented by one piece of hardware or may be implemented by distributed processing by a plurality of pieces of hardware.

Further, the above-described components, functions, processing units, and the like may be implemented by software by a processor included in a computer interpreting and executing a program for realizing each function. Information such as a program, a table, and a file for realizing each function can be stored in a recording device such as a memory, a hard disk, and a solid state drive (an SSD), or a recording medium such as an IC card, an SD card, and an optical disk.

What is claimed is:

1. A transmission device monitoring system that monitors a transmission device driven by a motor, the transmission device monitoring system comprising:
    a diagnostic frequency estimation unit that extracts a plurality of diagnostic frequency candidate groups from a frequency region separated by a specific frequency or more using at least current information on the motor, a gear ratio of the transmission device, and the number of stages of the transmission device, and estimates a frequency satisfying a specific relationship from frequencies obtained in the plurality of diagnostic frequency candidate groups as a diagnostic frequency; and
    an abnormality diagnosis unit that diagnoses abnormality of the transmission device using at least the one diagnostic frequency estimated by the diagnostic frequency estimation unit.

2. The transmission device monitoring system according to claim 1, wherein the current information on the motor is obtained from a current sensor installed in at least one phase of the motor.

3. The transmission device monitoring system according to claim 1, wherein the current information on the motor is a torque current that can be obtained from a drive power supply that drives the motor.

4. The transmission device monitoring system according to claim 2, wherein
    when the plurality of diagnostic frequency candidate groups are two,
    a first diagnostic frequency candidate group includes one or more frequencies extracted from a sideband wave of a meshing frequency of a meshing gear of the transmission device, and
    a second diagnostic frequency candidate group includes one or more frequencies extracted from other than the sideband wave of the meshing frequency of the meshing gear of the transmission device.

5. The transmission device monitoring system according to claim 2, wherein
    when the plurality of diagnostic frequency candidate groups are two,
    a first diagnostic frequency candidate group includes one or more frequencies extracted from a sideband wave of a frequency obtained by adding a power supply frequency of a drive power supply of the motor to a meshing frequency of a meshing gear of the transmission device, and
    a second diagnostic frequency candidate group includes one or more frequencies extracted from other than the sideband wave of the frequency obtained by adding the power supply frequency of the drive power supply of the motor to the meshing frequency of the meshing gear of the transmission device.

6. The transmission device monitoring system according to claim 4, wherein the specific frequency satisfies a relationship that the specific frequency is obtained by subtracting (frequency extracted from the second diagnostic frequency candidate group×2) from the meshing frequency of the meshing gear of the transmission device, or is the meshing frequency of the meshing gear.

7. The transmission device monitoring system according to claim 5, wherein the specific frequency satisfies a relationship that the specific frequency is obtained by subtracting (frequency extracted from the second diagnostic frequency candidate group×2) from the meshing frequency of the meshing gear of the transmission device, or is the meshing frequency of the meshing gear.

8. The transmission device monitoring system according to claim 6, wherein the diagnostic frequency estimation unit selects a frequency that satisfies the relationship from the frequencies included in the second diagnostic frequency candidate group as the diagnostic frequency.

9. The transmission device monitoring system according to claim 6, wherein the abnormality diagnosis unit calculates degree of abnormality by inputting an amplitude component of the diagnostic frequency to a model constructed by any one of a regression model, a classification model, a cluster model, and a neural network model, or calculates the degree of abnormality of the transmission device by a result of comparison between the amplitude component of the diagnostic frequency and a threshold.

10. The transmission device monitoring system according to claim 2, wherein
    the diagnostic frequency estimation unit comprises:
    a diagnostic frequency candidate extraction unit that calculates a frequency of a post-shift rotating shaft in a current gear position on the basis of a speed of the motor, the gear ratio of the transmission device, the current gear position of the transmission device, and an input frequency of the current gear position, extracts one or more frequencies as a second diagnostic frequency candidate group from a frequency spectrum obtained from the current information on the motor on the basis of the frequency of the post-shift rotating shaft, and extracts one or more frequencies as a first diagnostic frequency candidate group from the frequency spectrum obtained from the current information on the motor on the basis of a meshing frequency of a gear constituting the current gear position; and a diagnostic frequency selection unit that selects a frequency satisfying a specific relationship from frequencies obtained from the first diagnostic frequency candidate group and the second diagnostic frequency candidate group as the diagnostic frequency.

11. The transmission device monitoring system according to claim 10, wherein the diagnostic frequency estimation unit estimates the speed of the motor by dividing a frequency obtained by analyzing the current information on the motor by the number of poles of the motor.

* * * * *